United States Patent
Nomura et al.

(10) Patent No.: US 6,763,700 B2
(45) Date of Patent: Jul. 20, 2004

(54) TRAP APPARATUS

(75) Inventors: Norihiko Nomura, Fujisawa (JP); Nobuharu Noji, Zushi (JP); Kiyoshi Yanagisawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/387,567

(22) Filed: Mar. 14, 2003

(65) Prior Publication Data

US 2003/0172713 A1 Sep. 18, 2003

Related U.S. Application Data

(62) Division of application No. 09/986,672, filed on Nov. 9, 2001, now Pat. No. 6,553,811.

(30) Foreign Application Priority Data

Nov. 13, 2000 (JP) .................................. 2000-345139
Jan. 16, 2001 (JP) ...................................... 2001-8325

(51) Int. Cl.[7] .............................................. G01M 3/02
(52) U.S. Cl. .......................................................... 73/37
(58) Field of Search ......................... 73/46, 37, 861.46; 156/51, 345.29; 62/55.5; 251/173

(56) References Cited

U.S. PATENT DOCUMENTS

| | | |
|---|---|---|
| 3,719,070 A | 3/1973 | Hanes |
| 3,894,741 A | 7/1975 | McHugh |
| 4,268,329 A | 5/1981 | Jervis |
| 4,831,875 A | 5/1989 | Twerdochlib |
| 4,835,974 A | 6/1989 | Spahn |
| 5,515,734 A | 5/1996 | Malminen |
| 5,758,882 A | 6/1998 | Torzewski |
| 6,149,130 A | 11/2000 | Thurston et al. |
| 6,158,226 A | 12/2000 | Noji et al. |
| 6,244,099 B1 | 6/2001 | Ball et al. |
| 6,334,928 B1 | 1/2002 | Sekine et al. |
| 6,368,371 B1 * | 4/2002 | Nomura et al. ............... 55/309 |

FOREIGN PATENT DOCUMENTS

| | | | |
|---|---|---|---|
| EP | 0 811 413 | 12/1997 | |
| EP | 0 823 279 | 2/1998 | |
| EP | 0 847 789 | 6/1998 | |
| EP | 0 847 790 | 6/1998 | |
| EP | 1 050 681 | 11/2000 | |
| EP | 1050681 | * 11/2000 | .......... F04B/37/16 |
| JP | 10176662 | 6/1998 | |
| JP | 10266956 | 10/1998 | |

OTHER PUBLICATIONS

US 6,398,831, 6/2002, Nomura (withdrawn)

* cited by examiner

Primary Examiner—Robert Raevis
(74) Attorney, Agent, or Firm—Wenderoth, Lind & Ponack, L.L.P.

(57) ABSTRACT

A continuous processing trap apparatus is capable of increasing the trapping efficiency while maintaining conductance required by a vacuum chamber. The trap apparatus includes an exhaust passage for evacuating a hermetically sealed chamber by a vacuum pump, a hermetically sealed trapping and regenerating casing extending across the exhaust passage and a regenerating passage adjacent to the exhaust passage, and a trap unit movably housed in the trapping and regenerating casing for selective movement between a trapping position connected to the exhaust passage and a regenerating position connected to the regenerating passage. The trap apparatus further includes valve bodies disposed one on each side of the trap unit and supporting seals on outer circumferential surfaces thereof for sealing the exhaust passage and the regenerating passage from each other, and a monitoring mechanism for monitoring whether the seals are functioning normally.

12 Claims, 11 Drawing Sheets

TRAP APPARATUS

This is a divisional application of Ser. No. 09/986,672, filed Nov. 9, 2001 now U.S. Pat. No. 6,553,811.

BACKGROUND OF THE INVENTION

1. Field of the Invention

The present invention relates to a trap apparatus for use in an evacuating system for evacuating a vacuum chambers in a semiconductor fabrication apparatus or the like, and more particularly to a continuous processing trap apparatus having trap units disposed to switch between an exhaust path and a regeneration path.

2. Description of the Related Art

Figure 14:
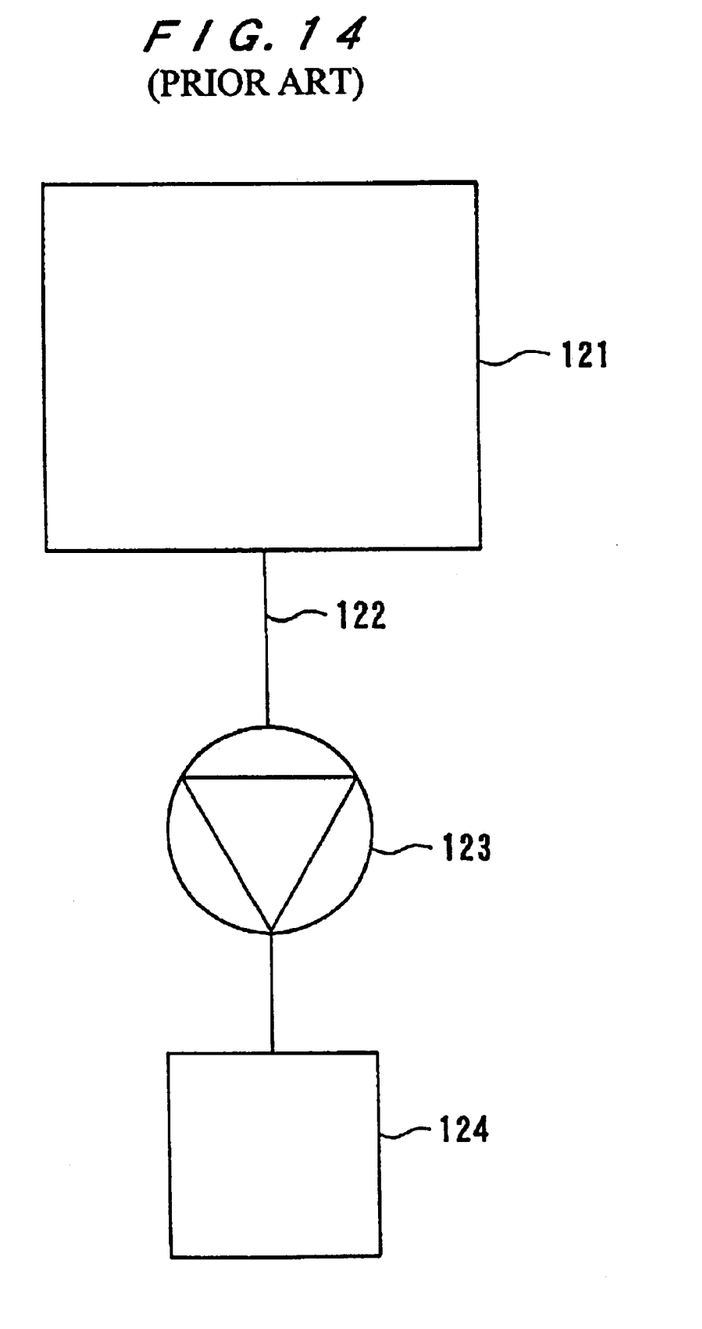
FIG. 14 is a block diagram of a conventional evacuating system.

One conventional evacuating system will be described below with reference to FIG. 14 of the accompanying drawings. In FIG. 14, a vacuum chamber 121 serves as a process chamber for use in a semiconductor fabrication process that is carried out by an etching apparatus, a chemical vapor deposition apparatus (CVD), or the like. The vacuum chamber 121 is connected to a vacuum pump 123 by a pipe 122. The vacuum pump 123 serves to increase the pressure of a process exhaust gas from the vacuum chamber 121 to the atmospheric pressure. The vacuum pump 123 has heretofore been composed of an oil rotary pump, but mainly comprises a dry pump at present.

If the level of vacuum required by the vacuum chamber 121 is higher than the level of vacuum that can be achieved by the vacuum pump 121, then an ultrahigh vacuum pump such as a turbo-molecular pump or the like is disposed upstream of the vacuum pump 123. An exhaust gas processing apparatus 124 is disposed downstream of the vacuum pump 123, and gas components that cannot be directly discharged into the atmosphere because of their toxicity and explosibility depending on the process are treated by a process such as adsorption, decomposition, absorption by the exhaust gas processing apparatus 124, from which only harmless gases are discharged into the atmosphere. Necessary values are provided at appropriate positions of the pipe 122.

The conventional evacuating system is disadvantageous in that if a substance having a high sublimation temperature is contained in the reaction by-products contained in the exhaust gas, then the gas is solidified while its pressure is being increased, and deposited in the vacuum pump, thus tending to cause a failure of the vacuum pump.

For example, if $BCl_3$ or $Cl_2$ which is a typical process gas for aluminum etching is used, then the remainder of the process gas of $BCl_3$ or $Cl_2$ and a reaction by-product of $AlCl_3$ are discharged from the process chamber by the vacuum pump. $AlCl_3$ is not deposited in the suction side of the vacuum pump because its partial pressure is low. However, while $AlCl_3$ is being discharged under pressure, its partial pressure rises, and it is deposited, solidified, and attached to the inner pump wall, resulting in a failure of the vacuum pump. The same problem occurs with reaction by-products of $(NH_4)_2SiF_6$ and $NH_4Cl$ that are produced from a CVD apparatus for depositing films of SiN.

It has heretofore been attempted to heat the vacuum pump in its entirety to pass the reaction by-products in a gaseous state through the vacuum pump so that no solid substance is deposited in the vacuum pump. This attempt has been effective to prevent a solid substance from being deposited in the vacuum pump, but has been problematic in that a solid substance is deposited in the exhaust gas processing apparatus disposed downstream of the vacuum pump, thereby clogging a filled layer in the exhaust gas processing apparatus.

One solution is to install a trap apparatus upstream or downstream of the vacuum pump for trapping products for removal of components which will generate solid substances for thereby protecting various devices provided at the discharge path. The conventional trap apparatuses generally have such a poor trapping efficiency that about 60% of the components of the exhaust gas flows through the trap apparatus without being deposited in the trap unit. Those components flowing through the trap apparatus are deposited in downstream pipes and various devices. The reasons for the poor trapping efficiency are considered to be the fact that the exhaust gas flows in regions where the trapping efficiency is poor between an inner wall surface of the casing and the trap unit in the trap apparatus, and is unprocessed and discharged therefrom.

SUMMARY OF THE INVENTION

It is therefore an object of the present invention to provide a continuous processing trap apparatus which is capable of increasing the trapping efficiency while maintaining conductance required by a vacuum chamber and also of stably regenerating a trap unit by removing trapped reaction by-products in inline arrangements.

According to the present invention, there is provided a trap apparatus including an exhaust passage for evacuating a hermetically sealed chamber by a vacuum pump, a hermetically sealed trapping and regenerating casing extending across the exhaust passage and a regenerating passage adjacent to the exhaust passage, a trap unit movably housed in the trapping and regenerating casing for selective movement between a trapping position connected to the exhaust passage and a regenerating position connected to the regenerating passage, valve bodies disposed one on each side of the trap unit and supporting seals on outer circumferential surfaces thereof which are held in contact with an inner circumferential surface of the trapping and regenerating casing for sealing the exhaust passage and the regenerating passage from each other, and a monitoring device for monitoring whether the seals are functioning normally.

The continuous processing trap apparatus thus constructed is capable of increasing the trapping efficiency while maintaining conductance required by a vacuum chamber and also of performing a regenerating process in inline arrangements. The continuous processing trap apparatus has seals capable of hermetically sealing trapping and regenerating chambers from each other in the trapping and regenerating casing, and also a monitoring mechanism for monitoring whether the seals are functioning normally. The continuous processing trap apparatus can thus simultaneously and stably trap, and remove reaction by-products in exhaust gases, i.e. regenerate the trap unit. Consequently, the burden on the operator who performs maintenance of the trap apparatus is greatly lightened.

It is preferable to provide double seals disposed on each of the outer circumferential surfaces of the valve bodies, and a seal monitoring mechanism for monitoring pressure variations or flow rate variations in hermetically sealed spaces between the double seals. It is also preferably to provide a pressure sensor for detecting such pressure variations or flow rate variations. Flow rate variations may be detected by a mass flow meter.

The seal monitoring mechanism may preferably comprise a device for creating a vacuum or pressurization in the hermetically sealed spaces and monitoring a sealing capability of the seals based on a variation in the vacuum or pressurization.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Embodiments of the present invention will be described below with reference to the drawings.

Figure 1:
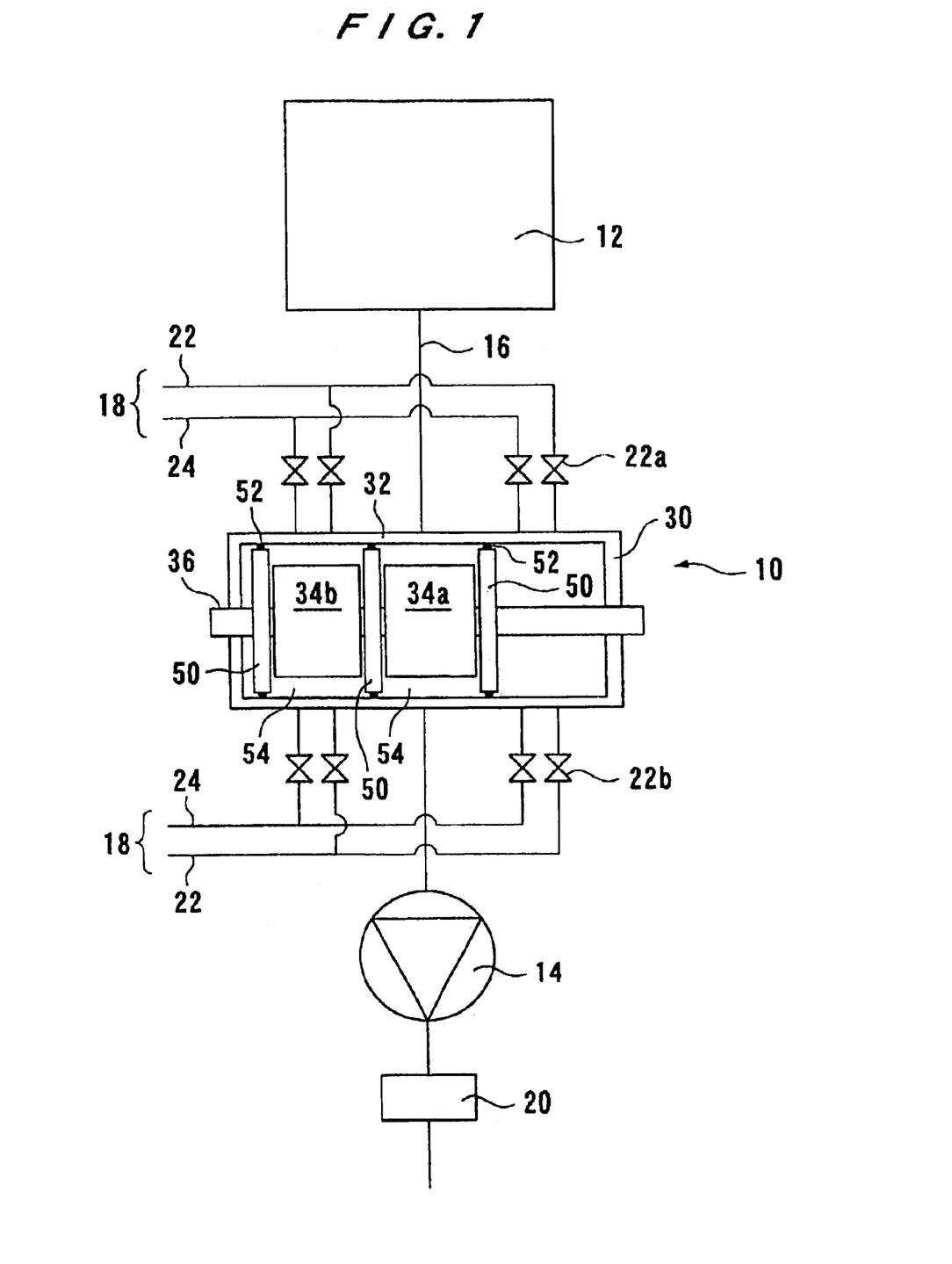
FIG. 1 is a view of a trap apparatus according to an embodiment of the present invention.
Figure 2A:
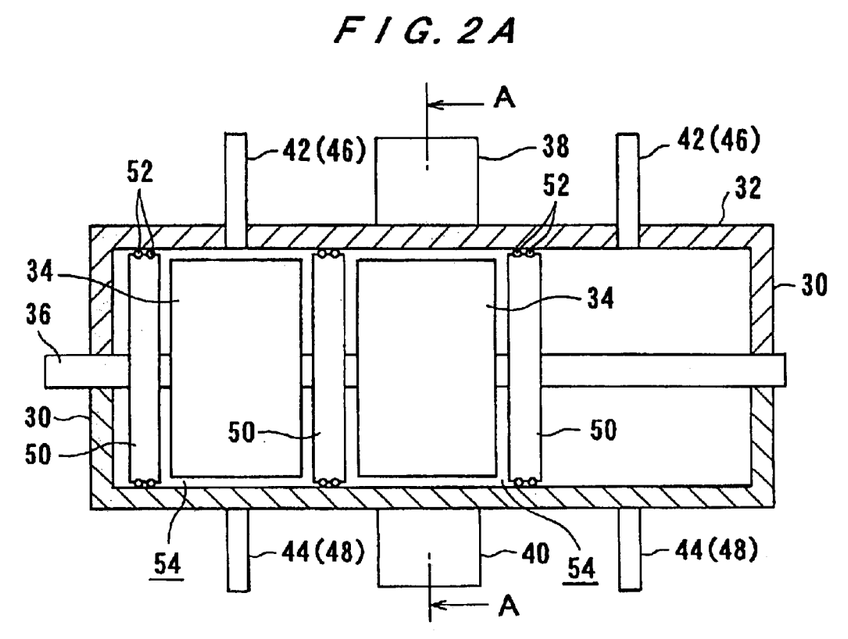
FIG. 2A is an axial cross-sectional view of the trap apparatus shown in FIG. 1.

FIGS. 1 and 2 show a continuous processing trap apparatus 10 according to an embodiment of the present invention. The continuous processing trap apparatus 10 is disposed across an exhaust passage 16 through which a hermetically sealed chamber 12 is evacuated by a vacuum pump 14, and regeneration passages 18 adjacent to the exhaust passage 16. The vacuum pump 14 is shown as a single vacuum pump, but a plurality of vacuum pumps connected in successive stages may be provided. An exhaust gas processing apparatus 20 is provided downstream of the vacuum pump 14 for removing harmful substances from exhaust gases. The exhaust gases are discharged from the vacuum (hermetically sealed) chamber 12 via the exhaust passage 16 by the vacuum pump 14. The continuous processing trap apparatus 10 is connected to the exhaust passage 16 between the hermetically sealed chamber 12 and the vacuum pump 14, for trapping reaction by-products in the exhaust gases.

The continuous processing trap apparatus 10 includes a trapping and regenerating casing 32 which has an exhaust position and two regenerating positions one on each side of the exhaust position. The exhaust passage 16 is connected to the continuous processing trap apparatus 10 at the exhaust position, and the regeneration passages 18 are connected to the continuous processing trap apparatus 10 at the regenerating positions. Reaction by-products in the exhaust gases discharged from the hermetically sealed chamber 12 are trapped by a trap unit 34a in the trap apparatus 10. At the same time, another trap unit 34b which has trapped reaction by-products is cleaned by a liquid introduced through liquid supply and discharge lines 22 and dried by a drying gas introduced through drying gas lines 24. Thus, the trap unit 34b is returned to an initial state. After cleaning and drying of the trap unit 34b is completed, the trap unit 34b is moved into the exhaust position across the exhaust passage 16 and starts to trap reaction by-products in the exhaust gases. The cleaning liquid for cleaning the trap unit comprises pure water, for example, and the drying gas for drying the trap unit comprises a pure $N_2$ gas, for example, for thereby keeping the interior of the trapping and regenerating casing 32 clean.

The trapping and regenerating casing 32 houses therein a shaft 36 on which the two trap units 34a, 34b are mounted for trapping reaction by-products by cooling the trap units 34a, 34b with a coolant such as water or liquid nitrogen. Three valve bodies 50 are disposed on the shaft 36 on both sides of the trap units 34a, 34b and between the trap units 34a, 34b. Seals 52 are mounted in respective seal grooves formed in the outer circumferential surfaces of the valve bodies 50. By the three valve bodies 50 and the inner wall surface of the trapping and regenerating casing 32, the interior of the trapping and regenerating casing 32 is divided into two trapping and regenerating chambers 54 that are hermetically sealed by the seals 52.

The cleaning liquid lines 22 have control valves 22a, 22b, and the drying gas lines 24 have control valves 24a, 24b. The cleaning liquid line 22 and the drying gas line 24 which are connected upstream of the trap apparatus 10 extend as two regeneration passages 18 to supply the cleaning liquid and the drying gas to the trap apparatus 10. Further, the cleaning liquid line 22 and the drying gas line 24 which are connected downstream of the trap apparatus 10 extend as two regeneration passages 18 to discharge the cleaning liquid and the drying gas from the trap apparatus 10.

According to this embodiment, when the trap apparatus 10 is in the position shown in FIG. 1, the left trap unit 34b is in the left regenerating position to be regenerated, and the right trap unit 34a is in the exhaust position to trap reaction by-products. Then, the shaft 36 is moved to displace the left trap unit 34b into the exhaust position to trap reaction by-products and also to displace the right trap unit 34a into the right regenerating position to be regenerated. In this manner, the trap apparatus 10 performs regenerating and trapping actions successively to continuously trap reaction by-products. The trap apparatus 10 can thus trap reaction by-products in the exhaust gases discharged from the hermetically sealed chamber 12 and be regenerated without the need to be shut off for regenerating the trap unit and to prepare a trap unit for replacement while the trap apparatus 10 is in operation for a long period of time.

The continuous processing trap apparatus 10 shown in FIG. 1 will be described in specific detail below. As shown in FIG. 2A, the continuous processing trap apparatus 10 has a substantially cylindrical trapping and regenerating casing 32 having opposite ends hermetically sealed by closing plates 30, a shaft 36 extending axially through the trapping and regenerating casing 32, a pair of trap units 34 mounted on the shaft 36 within the trapping and regenerating casing 32, and an air cylinder (not shown) as an actuating device for axially moving the shaft 36 back and forth. The trapping and regenerating casing 32 has an inlet port 38 and an outlet port 40 which are connected to the exhaust passage 16, cleaning liquid inlet ports 42 and cleaning liquid outlet ports 44 which are connected to the cleaning liquid lines 22, and purge ports 46 and exhaust ports 48 which are connected to the drying gas lines 24.

Three disk-shaped valve bodies 50 having an outside diameter slightly smaller than the inside diameter of the trapping and regenerating casing 32 are fixedly mounted on the shaft 36 on both sides of the trap units 34 and between the trap units 34. Annular seals 52 are mounted in respective seal grooves formed in the outer circumferential surfaces of the valve bodies 50. The annular seals 52 preferably comprise O-rings or cap seals. The annular seals 52 are of such a diameter that when they are placed in position between the trapping and regenerating casing 32 and the valve bodies 50, they are compressed by the bottoms of the seal grooves and the inner circumferential surface of the trapping and regenerating casing 32. When the seals 52 are intimately held against the inner circumferential surface of the trapping and regenerating casing 32, they seal the gaps between the inner circumferential surface of the trapping and regenerating casing 32 and the outer circumferential surfaces of the valve bodies 50. If the inner circumferential surface of the trapping and regenerating casing 32 is coated with a layer of Teflon or the like, the seals 52 are easily slidable on the inner circumferential surface of the trapping and regenerating casing 32, and the casing 32 is resistant to chemicals.

Hermetically sealed trapping and regenerating chambers 54 having the trap units 34 therein are defined between the valve bodies 50 in the trapping and regenerating casing 32. The trapping and regenerating chambers 54 serve as a trapping chamber, respectively when the trap units 34 are placed in the exhaust or trapping position connected to the exhaust passage 16, and as a regenerating chamber when the trap units 34 are placed in the generating positions connected to the regeneration passages 18.

Since the seals 52 are mounted on the outer circumferential surfaces of the valve bodies 50, it is not necessary to provide members or portions projecting from the inner circumferential surface of the trapping and regenerating casing 32 to define the trapping position and the regenerating positions. Therefore, even if the outside diameter $d_1$ (see FIG. 2B) of the trap units 34 is substantially equal to the inside diameter $d_2$ of the trapping and regenerating casing 32, the trap units 34 can smoothly move in the trapping and regenerating casing 32. Because the gaps between the trap units 34 and the trapping and regenerating casing 32 are small, the proportion of any gases of the exhaust gases introduced into the trapping and regenerating casing 32 which flow past the trap units 34 out of contact with the trap units 34 is reduced, thus enhancing trapping efficiency.

Each of the trap units 34 comprises a plurality of baffle plates fixed to the shaft 36 by welding or the like, and is cooled by a cooling thermal medium of a liquid such as liquid nitrogen or cooled air or water that is introduced into the shaft 36. Temperature sensors (not shown) are mounted on the trap units 34 at certain positions for detecting temperatures, and pressure sensors (not shown) are mounted in the exhaust passage 16 at the positions upstream and downstream of the trap unit 34 for detecting a differential pressure across the trap unit 34.

Operation of the continuous processing trap apparatus having the above structure will be described below. When the right trap unit 34 is in the trapping position connected to the exhaust passage 16 and the corresponding trapping and regenerating chamber 54 serves as the trapping chamber, a cooling thermal medium is introduced into the shaft 36 to cool the trap unit 34. Certain components of the exhaust gases flowing into the trapping and regenerating chamber 54 are brought into contact with the trap unit 34, and deposited and trapped in the trap unit 34.

Figure 2B:
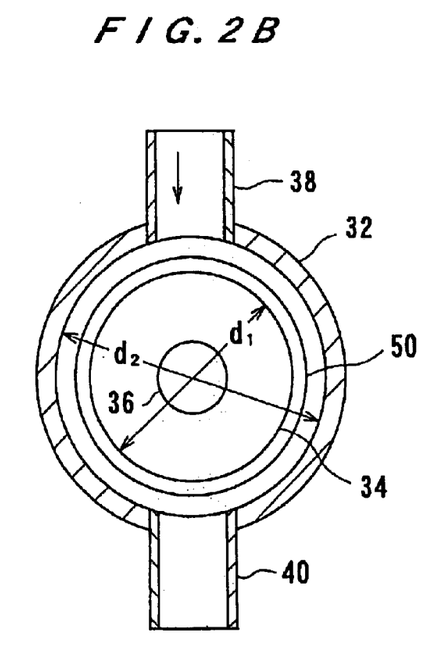
FIG. 2B is a cross-sectional view taken along line A—A of FIG. 2A.

Since the outside diameter $d_1$ of the trap unit 34 is close to the inside diameter $d_2$ of the trapping and regenerating casing 32, the amount of any introduced exhaust gases flowing past the trap unit 34 out of contact with the trap unit 34 is small. Therefore, the trapping efficiency with respect to reaction by-products in the exhaust gases is increased while keeping the conductance of the exhaust gases which does not affect the process in the hermetically sealed chamber 12 and the performance of the vacuum pump 14. The inventors of the present application tested the trap apparatus 10 for a trapping efficiency with respect to $NH_4Cl$, and confirmed that the trapping efficiency of 98% was achieved and the conductance was of such a value as not to cause any problem in the semiconductor fabrication apparatus.

When the trapping process is completed, the cooling of the trap unit 34 is stopped, and the air cylinder is actuated to axially move the shaft 36 for thereby moving the right trap unit 34 to the right regenerating position connected to the regeneration passage 18. With the right trapping and regenerating chamber 54 being connected to the cleaning liquid line 22 and the drying gas line 24, the cleaning liquid is introduced from the cleaning liquid inlet port 42 into the trapping and regenerating chamber 54. The trapped reaction by-products are dissolved in the cleaning liquid and/or peeled off by the physical action of the cleaning liquid, carried away with the cleaning liquid, and discharged from the cleaning liquid outlet port 44. After the cleaning of the trap unit 34 is completed, the drying gas such as the $N_2$ gas is introduced from the drying gas purge port 46 into the trapping and regenerating chamber 54 to dry the trap unit 34 and the trapping and regenerating chamber 54, and then discharged from the exhaust port 48. When the drying process is completed, the right trap unit 34 is returned to the trapping position connected to the exhaust passage 16 for a next trapping process.

Inasmuch as the trapping and regenerating chamber 54 is hermetically sealed by the seals 52 mounted on the outer circumferential surfaces of the valve bodies 50, contaminants are prevented from entering the exhaust passage 16 and the regenerating passages 18 when the trap unit traps reaction by-products and is regenerated.

When the trap units 34 are stopped, the seals 52 are held in intimate contact with the inner circumferential surface of the casing, thus providing a sufficient sealing action. When the trap units 34 are being moved, the seals 52 are retracted into the valve bodies 50 to avoid friction caused by sliding motion and shocks caused when the seals 52 are moved past steps provided by the gas inlet and outlet ports, and the cleaning liquid and drying gas inlet and outlet ports.

Figure 3A:
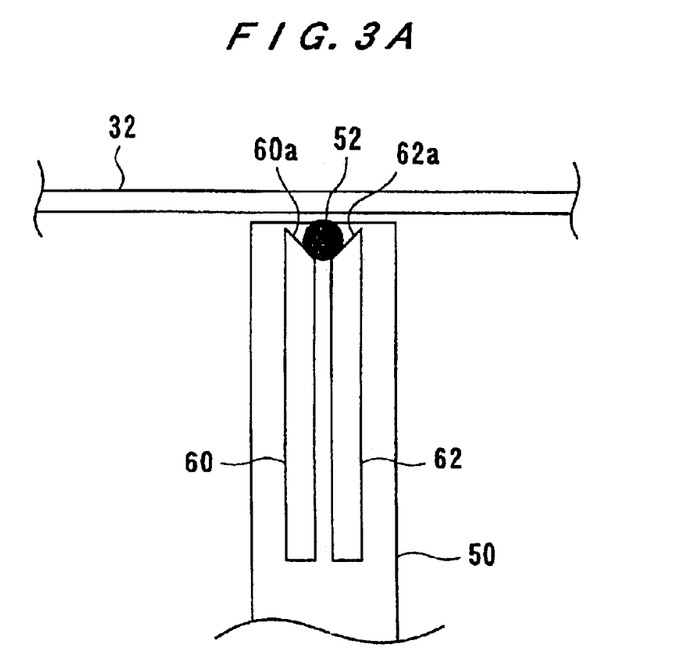
FIG. 3A is a cross-sectional view showing a seal member spreading device of the trap apparatus shown in FIGS. 2A and 2B in such a state that a value body is moved.
Figure 3B:
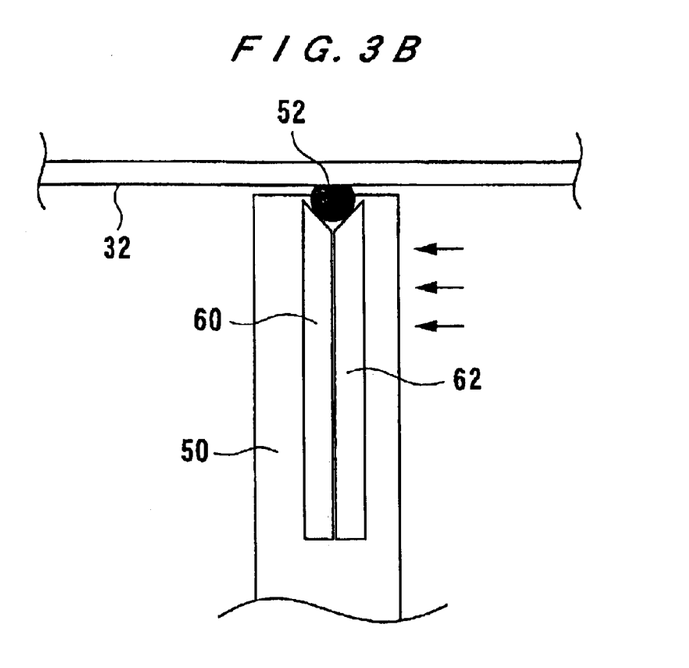
FIG. 3B is a cross-sectional view showing the seal member spreading device of the trap apparatus shown in FIGS. 2A and 2B in such a state that the value body is stopped (sealed)

FIGS. 3A and 3B are illustrative of a mechanism for applying external forces to the valve body which supports the seal to project and retract the seal. The valve body 50 has a pair of disks 60, 62 movable toward and away from each other by the air cylinder (not shown) which moves the shaft 36 back and forth. The disk 60 has a tapered surface 60a on its outer circumferential edge, and the disk 62 also has a tapered surface 62a on its outer circumferential edge. These tapered surfaces 60a, 62a jointly provide a V-shaped cross section which spreads radially outwardly. The seal 52 is disposed so as to be in contact with the tapered surfaces 60a, 62a.

When the disks 60, 62 are spaced away from each other, as shown in FIG. 3A, the seal 52 is placed in a region surrounded by the tapered surfaces 60a, 62a and has an outer circumferential end slightly projecting radially outwardly from the outer circumferential edges of the disks 60, 62. When the disks 60, 62 are moved toward each other, as shown in FIG. 3B, the seal 52 is pressed by the tapered surfaces 60a, 62a and spread radially outwardly. The seal 52 is now held in close contact with the tapered surfaces 60a, 62a and the inner circumferential surface of the trapping and regenerating casing 32 in a triangular groove fashion, thus reliably sealing the gap therebetween. While only one seal 52 is shown in FIGS. 3A and 3B, the same mechanism can be used with a double seal structure having two seals 52 on the outer circumferential surface of the valve body 50.

The trap units 34 which are associated with the sealing mechanism shown in FIGS. 3A and 3B are switched around as described below. Before the air cylinder is actuated to move the shaft 36, the disks 60, 62 of the valve body 50 are moved away from each other for thereby accommodating the seal 52 in the region surrounded by the tapered surfaces 60a, 62a. After the movement of the trap units 34 by the shaft 36 is completed, the disks 60, 62 of the valve body 50 are moved toward each other for thereby pressing the seal 52 with the tapered surfaces 60a, 62a to bring the seal 52 into close contact with the tapered surfaces 60a, 62a and the inner circumferential surface of the trapping and regenerating casing 32, thus sealing the gap therebetween.

By spreading the seal 52 radially outwardly into close contact with the inner circumferential surface of the trapping and regenerating casing 32, the trapping and regenerating chamber 54 is sufficiently sealed when the valve body 52 is stopped (sealed). When the valve body 50 is moved, the seal 52 is radially contracted to reduce the projection thereof from the outer circumferential surface of the valve body 50. The seal 52 is thus subject to reduced friction caused by sliding motion and also reduced shocks upon movement across steps at the inlet port 38, the exhaust port 40, the cleaning liquid inlet and outlet ports 42, 44, and the drying gas purge and exhaust ports 46, 48, and hence has increased durability.

Figure 4:
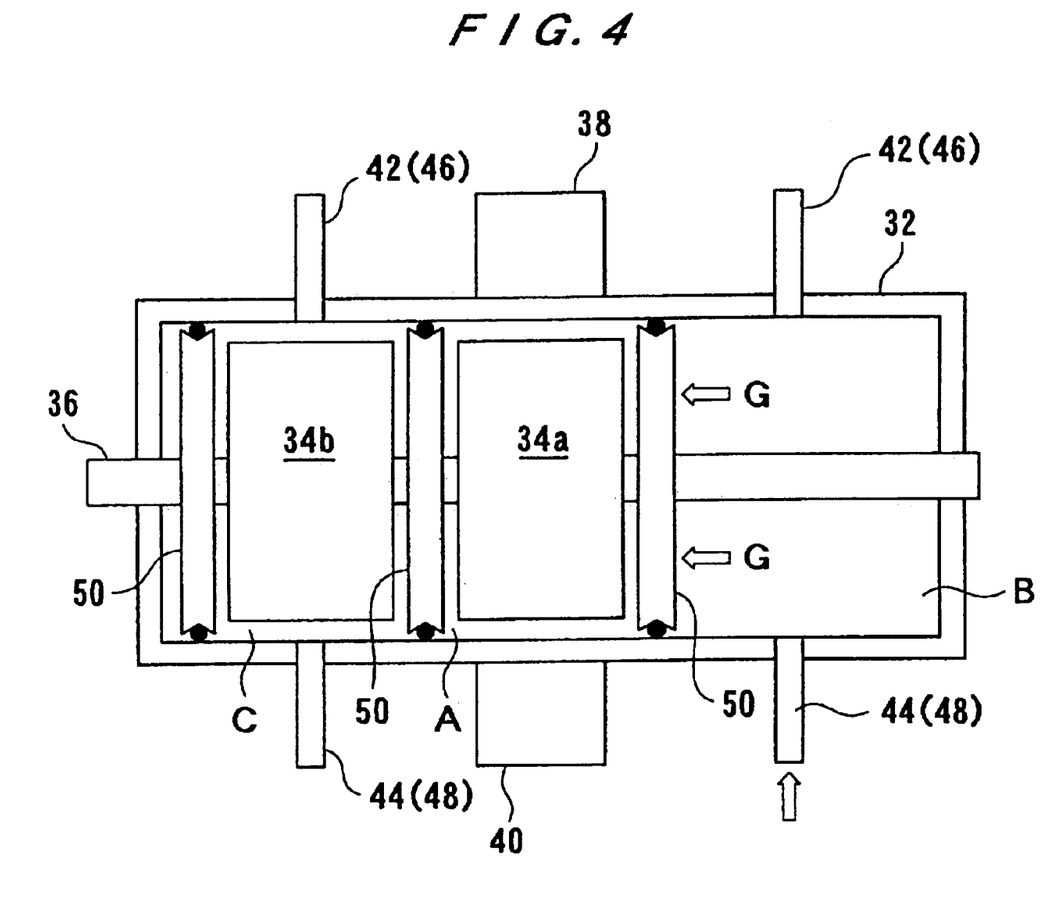
FIG. 4 is a cross-sectional view of a mechanism for moving valve bodies of the trap apparatus shown in FIGS. 2A and 2B.

FIG. 4 shows a trap apparatus which introduces a gas into the trapping and regenerating casing 32 to provide a device for applying an external force to the valve bodies 50. As shown in FIG. 4, a pressurized gas G is introduced into the trapping and regenerating casing 32 from the pipe 42 or 46 connected thereto to push the valve bodies 50 for thereby radially spreading the seals 52, e.g. O-rings with the mechanism described above. In the trapping and regenerating casing 32, a vacuum is created in a chamber A, a pressure is developed in a chamber B, and a pressure near the atmospheric pressure or the regenerating liquid pressure or the drying gas ($N_2$) Pressure is developed in a chamber C. These chambers A, B, C are hermetically sealed by the seals 52. The gas G under pressure may be a pure $N_2$ gas to keep the interior of the trapping and regenerating casing 32 clean.

Figure 5:
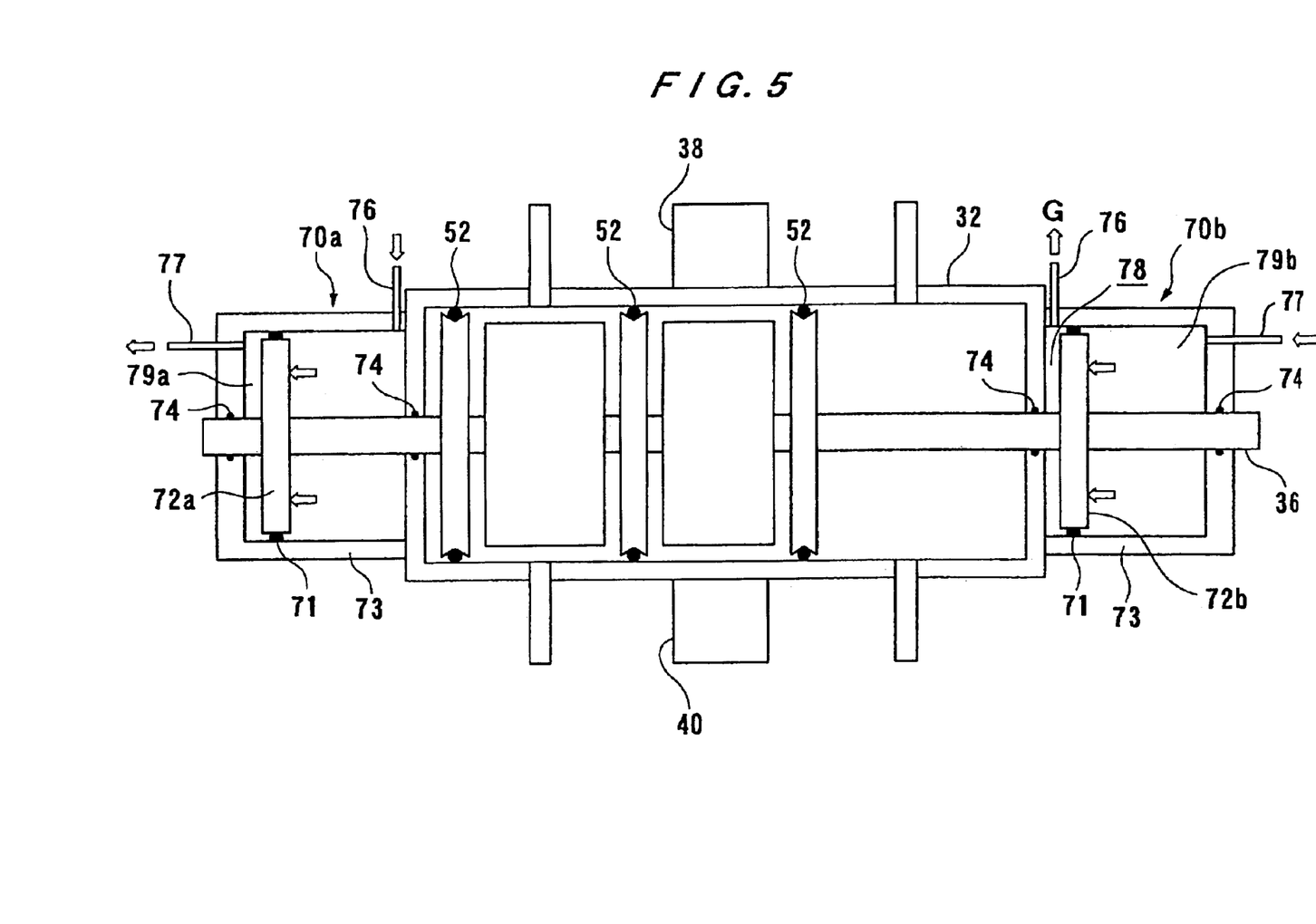
FIG. 5 is a cross-sectional view of another mechanism for moving valve bodies of the trap apparatus shown in FIGS. 2A and 2B.

FIG. 5 shows another mechanism for moving the valve bodies 50 of the trap apparatus. As shown in FIG. 5, a pressing mechanism is separate from the trapping and regenerating casing 32 and comprises a pair of cylinders 70a, 70b for moving the valve bodies 50. The cylinders 70a, 70b comprise respective piston 72a, 72b movably disposed in respective casings 73 and having packings 71 on their outer circumferential surfaces, seals 74 mounted in the casings 73 in contact with the shaft 36 for hermetically sealing the casings 73, and ports 76, 77 for introducing a compressed gas into and discharging the compressed gas from the cylinders 70a, 70b. The shaft 36 connected to the trap units is used as a piston rod connected to the pistons 72a, 72b.

For moving the valve bodies 50 to the left, a compressed gas G is introduced from the port 76 of the cylinder 70a into the cylinder 70a, and discharged from the cylinder 70a through the port 77 of the cylinder 70a. Similarly, a compressed gas G is introduced from the port 77 of the cylinder 70b into the cylinder 70b, and discharged from the cylinder 70b through the port 76 of the cylinder 70b. The pistons 72a, 72b are now moved to the left, and the valve bodies 50 fixedly mounted on the shaft 36 are moved to the left. While the valve bodies 50 are in motion, the gas is discharged from a chamber 78 in the cylinder 70b at a reduced rate controlled by a speed controller, for example, for thereby applying forces to spread the pistons 72a, 72b apart from each other to open the valve bodies 50 and thus retract the seals 52 such as O-rings. The valve bodies 50 can thus be moved with the seals 52 being retracted. The speed controller for controlling the rate of the compressed gas comprises a double solenoid valve assembly. For more reliable operation, the compressed gas may be supplied individually for each of the valve bodies.

After the completion of movement of the valve bodies 50, a compressed gas is introduced into a chamber 79b in the cylinder 70b and a chamber 79a in the cylinder 70a, thus pushing the pistons 72a, 72b. Thus, the valves 50 are contracted to project the seals (e.g. O-rings) 52 radially outwardly to seal the gaps between the valve bodies 50 and the trapping and regenerating casing 32. The mechanism shown in FIG. 5 is operated similarly when the valve bodies 50 are moved to the right. The compressed gas used to move the valve bodies 50 and radially spread and contract the seals 52 is isolated from the trapping and regenerating casing 32 by the packings 74. Since the cylinders 70a, 70b are separate from the trapping and regenerating casing 32, the compressed gas used to move the valve bodies 50 and radially spread and contract the seals 52 does not affect the level of vacuum in the trapping and regenerating casing 32.

The trap units may be moved in any of various fashions. For example, the shaft 36 may be axially moved back and forth by a motor or a separate cylinder.

Figure 6:
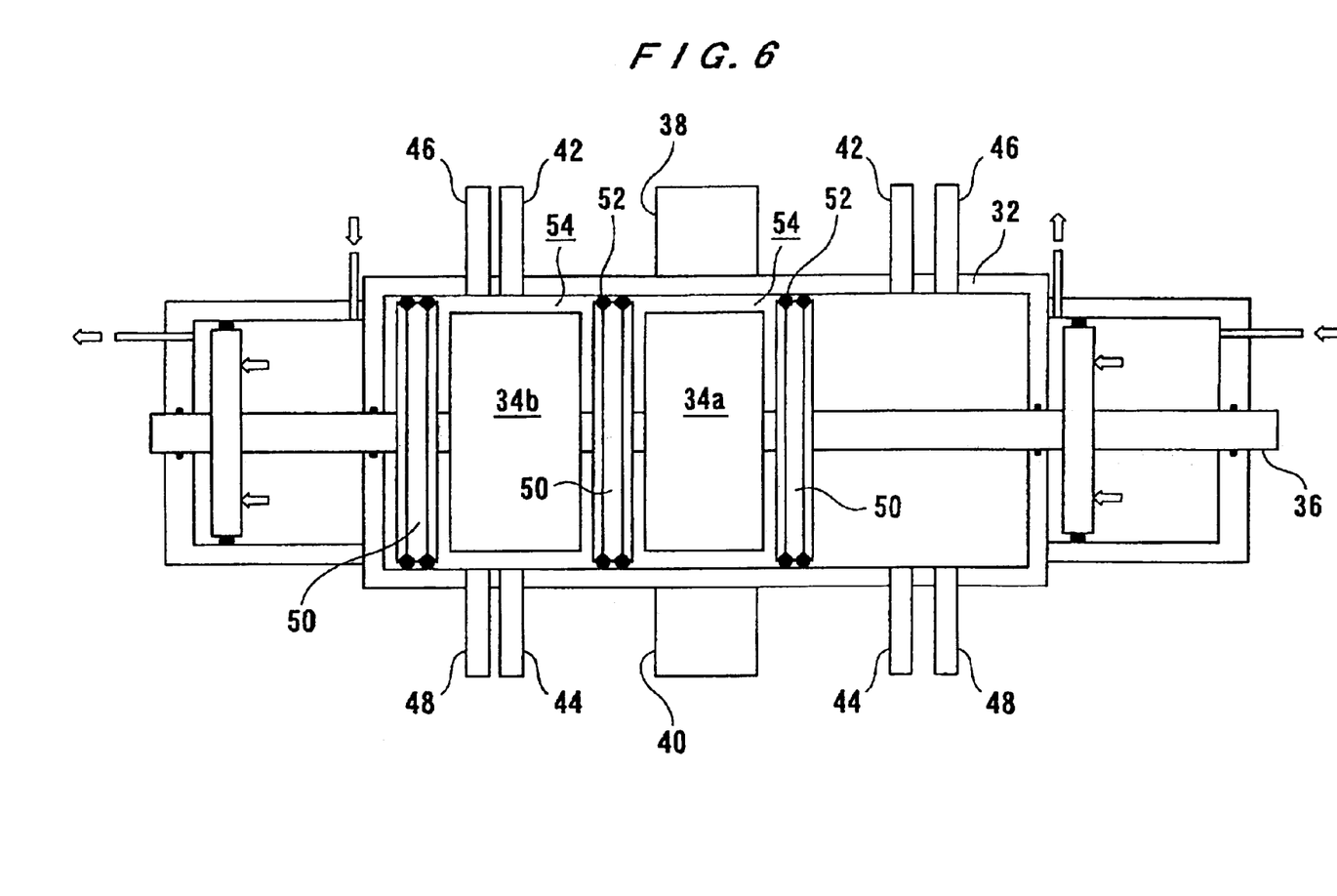
FIG. 6 is a cross-sectional view of a trap apparatus having valve bodies with double seals.

FIG. 6 shows a trap apparatus having valve bodies with double seals. Specifically, each of the seals, e.g. O-rings on the valve bodies 50 comprises a pair of seals for an increased sealing capability. Depending on the process associated with the trap apparatus, the evacuating line needs to be heated to prevent reaction by-products to be trapped from being deposited in other regions than the trap units. In such an application, the double seals are effective to increase the heat insulating effect in the sealing portion. For example, the trapping and regenerating casing 32 is heated by a heater to prevent reaction by-products to be trapped by the trap unit 34b from being deposited in the trapping and regenerating casing 32. At the same time, the trap unit 34a is in the regenerating position, and the cleaning liquid is applied thereto to cool the portion of the trapping and regenerating casing 32 surrounding the trap unit 34a. The trap unit 34b is in the trapping position, and the temperature of the portion of the trapping and regenerating casing 32 surrounding the trap unit 34b cannot be lowered. The double seals on each of the valve bodies 50 are effective to provide an increased heat insulating effect for thereby keeping the seals 52 associated with the trap unit 34b in a heated state.

Figure 7:
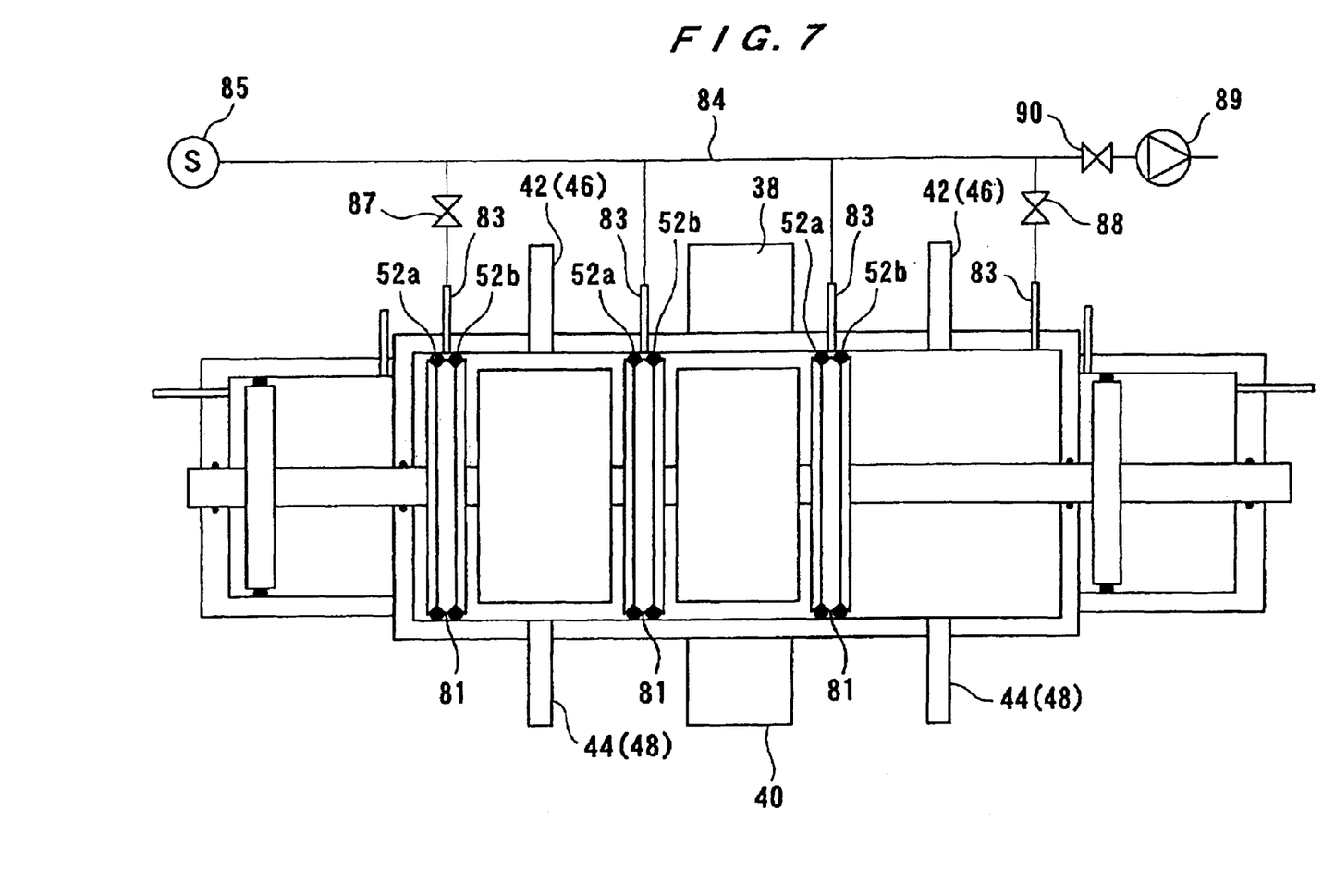
FIG. 7 is a cross-sectional view of a trap apparatus with a seal monitoring mechanism.

FIG. 7 shows a trap apparatus with a seal monitoring mechanism. The seal monitoring mechanism detects a pressure variation in the space between the seals 52a, 52b of each of the double seals for thereby monitoring the sealing capability of the seals. The two seals 52a, 52b, e.g. O-rings, of each of the double seals provide a hermetically sealed space 81 therebetween on the outer circumferential surface of the valve body. Seal monitoring pipes 83 are mounted on the trapping and regenerating casing 32 at the respective hermetically sealed spaces 81. The seal monitoring pipes 83 are connected to a single pipe 84 which is connected to a pressure sensor 85. When the seals 52a, 52b are radially spread to seal the gaps between the valve bodies 50 and the trapping and regenerating casing 32, the pressure sensor 85 monitors variations in the pressures in the spaces 81, i.e., a sealing capability. At this time, for monitoring the space 81 at the left end of the trapping and regenerating casing 32, a valve 87 connected to the seal monitoring pipe 83 at the left end is opened, and for monitoring the space 81 at the right end of the trapping and regenerating casing 32, a valve 88 connected to the seal monitoring pipe 83 at the right end is opened. In the illustrated embodiment, the three spaces 81 in the seals are simultaneously monitored by the single pressure sensor 85. However, pressure sensors may be connected to the respective seal monitoring pipes 83 for individually monitoring the pressures in the seals.

The sealing capability of the seals may be monitored by creating a vacuum in the hermetically sealed spaces 81 with a vacuum pump 89 and detecting variations in the pressures in the hermetically sealed spaces 81 with the pressure sensor 85. When the sealing process is not initiated by moving the valve bodies, a valve 90 connected to the vacuum pump 89 is closed to disable the seal monitoring mechanism. The vacuum pump 89 may be replaced with an ejector to maintain a low vacuum in the hermetically sealed spaces 81, and variations in the pressures in the hermetically sealed spaces 81 may be monitored. The seal monitoring pipes 83 may be connected to the outlet port 40, and the valve 90 may be opened at the time when no process is performed to evacuate the hermetically sealed spaces 81, and then the valve 90 may be closed and the vacuum may be monitored by the pressure sensor 85.

Figure 8:
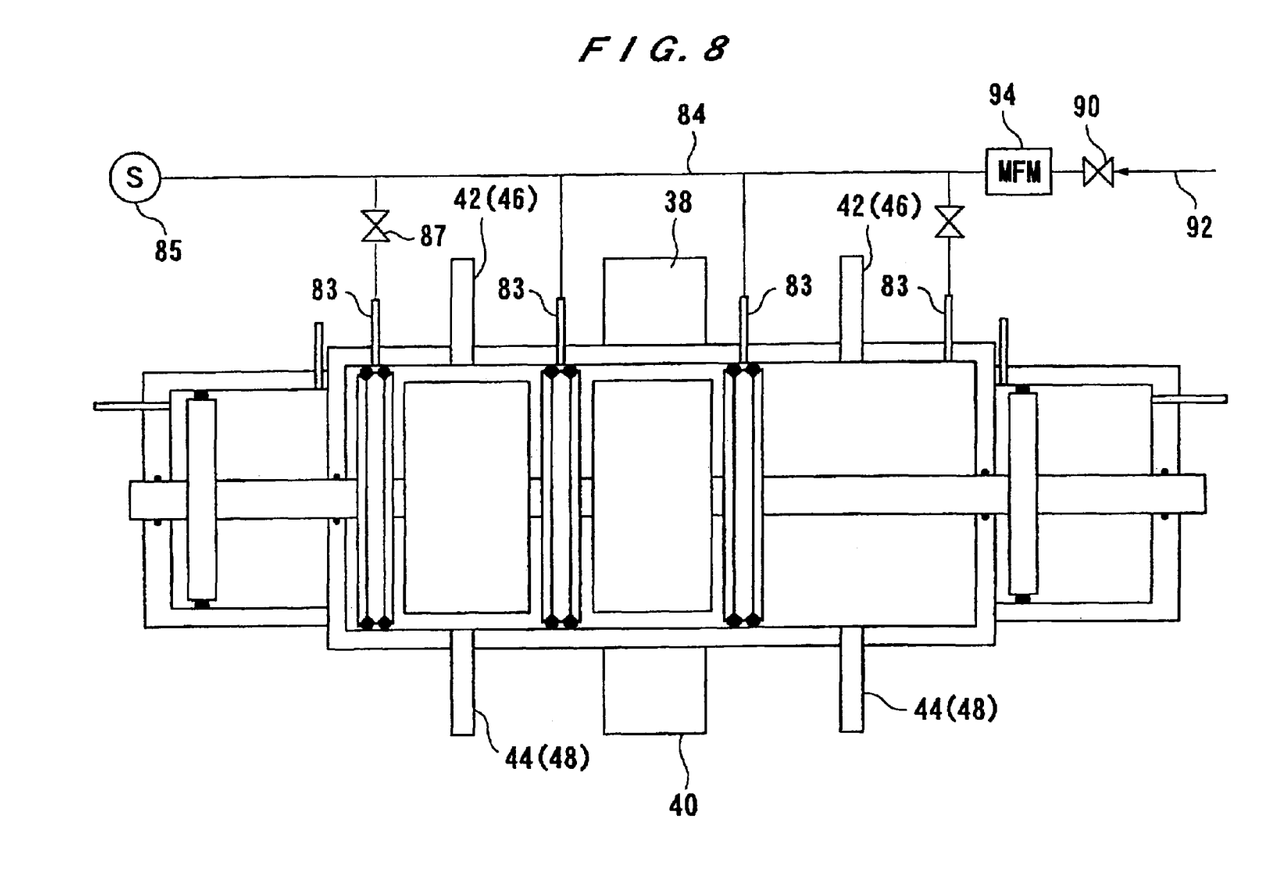
FIG. 8 is a cross-sectional view of a trap apparatus with a seal monitoring mechanism according to a modification of the seal monitoring mechanism shown in FIG. 7.

FIG. 8 shows a trap apparatus with a modified seal monitoring mechanism. In FIG. 8, the modified seal monitoring mechanism monitors the sealing capability of the double seals by detecting pressure variations with the pressure sensor 85 when the hermetically sealed spaces 81 between the seals are pressurized. A compressed gas such as an $N_2$ gas is introduced from a pipe 92 connected to the seal monitoring pipes 83 into the hermetically sealed spaces 81 between the seals to pressurize the hermetically sealed spaces 81. Since the hermetically sealed spaces 81 are connected to the pressure sensor 85 by the seal monitoring pipes 83, the sealing capability of the seals can be monitored by detecting pressure variations in the hermetically sealed spaces 81. A mass flow meter 94 may be connected to the pipe 92 for monitoring a gas leakage to monitor the sealing capability of the double seals. Since the hermetically sealed spaces between the seals in the double seals are pressurized, the cleaning liquid can be used more safely in the regenerating system adjacent to the evacuating or trapping system.

Each of the trap units of the trap apparatus will be described in detail. The trap apparatus according to the present invention has a structure for increasing the trapping efficiency for adsorbing reaction by-products in the exhaust gases progressively toward the center of the trap unit.

Figures 9A, 9B:
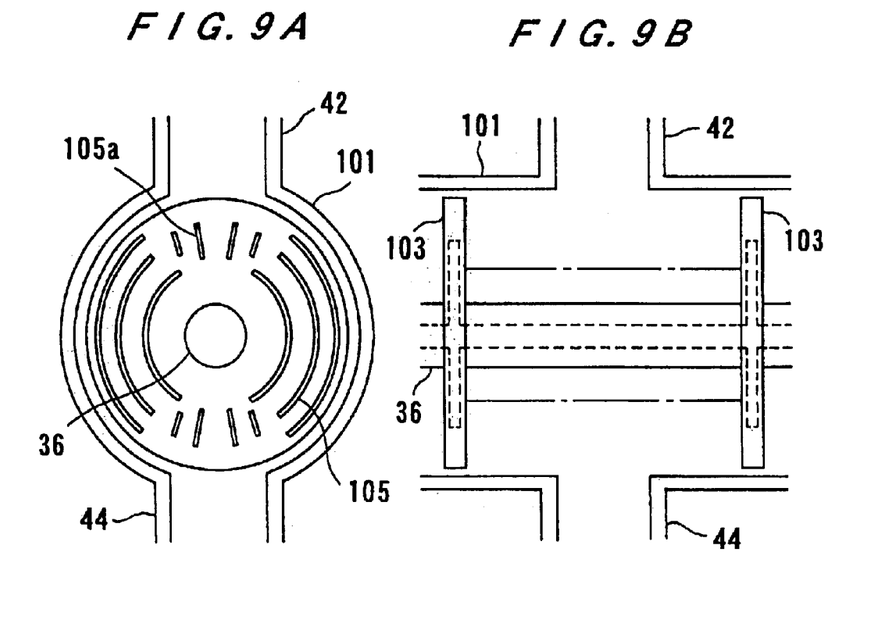
FIGS. 9A and 9B are views of a trap unit according to the present invention.

FIGS. 9A and 9B show a trap unit which has disk-shaped cooling bodies 103 disposed in a casing 101 and cooling fins 105 disposed between the disk-shaped cooling bodies 103. Reaction by-products in the exhaust gases tend to be deposited or precipitated on cooling fins 105a near the inlet of the trap unit. Therefore, the cooling fins 105a are displaced inwardly to space a region, where the reaction by-products tend to be deposited, away from the inlet of the casing. Thus, the reaction by-products are precipitated in the region shifted into the inner side of the trap unit, and hence prevented from contacting the casing 101 or dropping off or damaging the interior of the casing 101 while the trap unit moves into a regenerating position. The trapped reaction by-products are also prevented from entering or engaging the seals while the trap unit moves into the regenerating position.

Figure 10A:
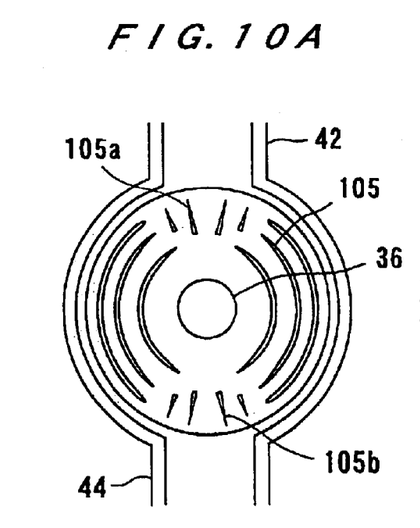
FIGS. 10A and 10B are views of a trap unit according to a modification of the trap unit shown in FIGS. 9A and 9B.
Figure 10B:
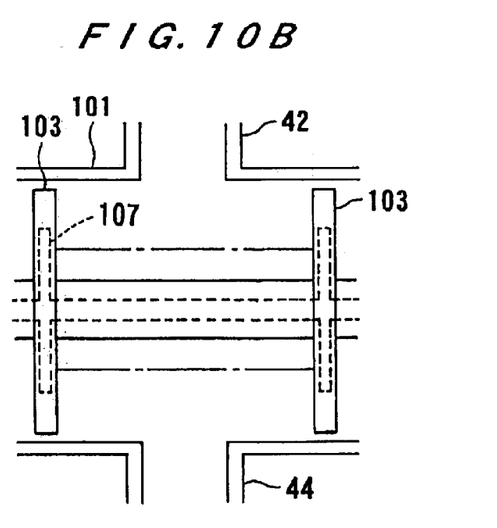

FIGS. 10A and 10B show another modified trap unit. The trap unit has fins 105, 105a as reaction by-product trapping elements which have a temperature gradient for depositing more reaction by-products within the trap. The fins 105, 105a have such a temperature distribution that their temperature is progressively lower toward the inner position of the shaft 36. The fins 105, 105b may be given a temperature gradient by mounting a cooling jacket 107 in a structural body 103 which supports the fins, and restricting the flow of a coolant into the inlet and outlet ports 42, 44 of the cooling jacket 107 within the inner coolant passage. The coolant is supplied through a pipe in the shaft 36 to the cooling jacket 107. The fins 105, 105a are progressively thinner toward the inlet and outlet ports 42, 44, as shown in FIG. 10A. In this manner, the amount of reaction by-products trapped near the inlet port 42 is suppressed, and the trapping efficiency is increased by making the fins thicker toward the shaft 36.

Figure 11:
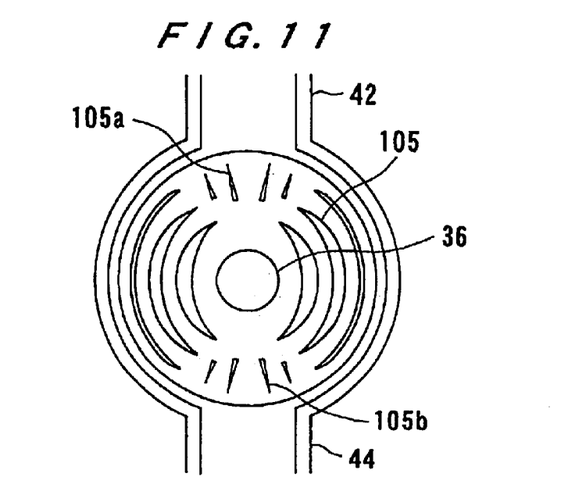
FIG. 11 is a view of a trap unit according to a modification of the trap unit shown in FIGS. 9A and 9B.

FIG. 11 shows still another modified trap unit having fins 105 as reaction by-product trapping elements which are progressively thicker toward the center of the trap unit. The cooling temperature of the fins 105 is lowered at the inner side of the trap unit to deposit more reaction by-products toward the center of the trap unit.

In order to increase the trapping efficiency toward the center of the trap unit, the fins 105a, 105b at the inlet and outlet ports 42, 44 of the cooling jacket 107 may be made of ceramics of low thermal conductivity. The fins may be joined to the cooling jacket by welding or screws. Use of screws is preferable because of low thermal conductivity which is provided by the screws. Those fins 105 which are positioned at the center of the trap unit may be made of a material of high thermal conductivity, e.g. copper or SUS, for an increased trapping efficiency. Because copper has a corrosion resistance problem, it should preferably be plated with Ni by electroless plating. The cooling jacket should preferably be made of a material of high thermal conductivity as with the fins 105.

Figure 12A:
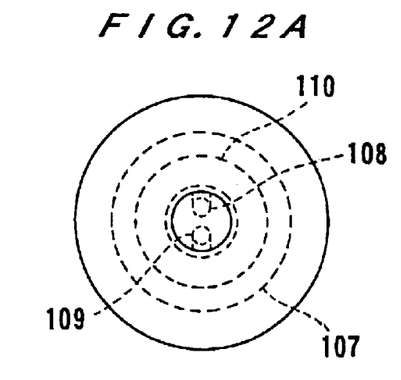
FIGS. 12A and 12B are views of a cooling jacket for a structural body which supports fins.
Figure 12B:
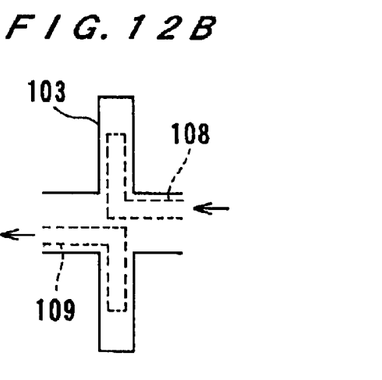

If the cooling jacket 107 is positioned at the center of the trap unit, then it is easy to control the temperature distribution of the trap unit. FIGS. 12A and 12B show a coolant passage in the cooling jacket 107. The cooling jacket 107 houses therein a coolant inlet pipe 108 and a coolant outlet pipe 109. In order to increase the trapping efficiency toward the center of the trap unit, the rate of the coolant may be differed at the central portion of the cooling jacket 107 and at the ends of cooling jacket 107. Specifically, the coolant passage in the cooling jacket 107 is designed to increase the rate of the coolant at the central portion of the cooling jacket 107 and reduce the rate of the coolant at the ends of cooling jacket 107. Such a rate difference develops a temperature gradient in the cooling jacket such that the temperature is lower at the central portion of the cooling jacket 107 and is progressively higher toward the ends of cooling jacket 107. A partition 110 may be employed to produce a coolant flow positively only at the central portion of the cooling jacket 107. The partition 110 may have a plurality of holes formed therein to produce some flows at the ends, or may be free of any holes.

Figure 13:
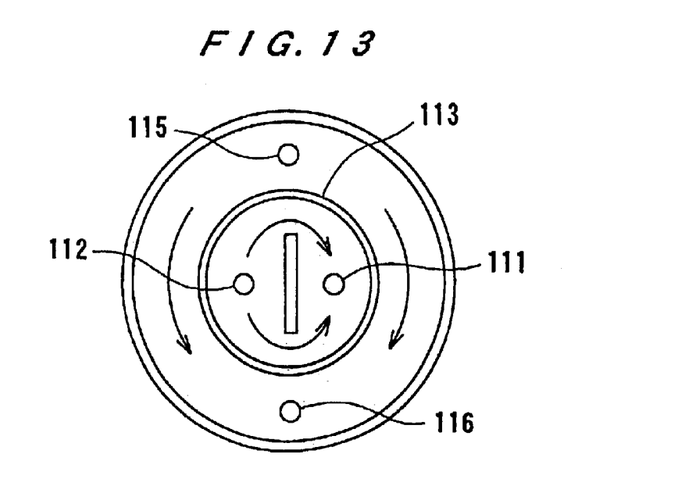
FIG. 13 is a view of another cooling jacket.

FIG. 13 shows another cooling jacket 107. As shown in FIG. 13, the cooling jacket 107 has a coolant inlet pipe 111 and a coolant outlet pipe 112 at its central portion, a partition 113 surrounding the coolant inlet pipe 111 and the coolant outlet pipe 112, and a coolant inlet pipe 115 and a coolant outlet pipe 116 disposed around the partition 113. Fluids having different temperatures are supplied to flow through the inner coolant inlet pipe 111 and the outer coolant inlet pipe 115. A structural body 103 which houses the coolant jacket 107 therein has a temperature gradient between the central portion and end thereof. As fins 105, 105a are fixed to the structural body 103, the trapping efficiency is increased at the central portion of the trap unit. The coolant flowing through the cooling jacket 107 may comprise cooling water, a coolant (liquid nitrogen), or a fluid cooled by a Peltier device. The coolant may be in a gaseous phase.

Different fluids may be supplied to flow through the inner coolant inlet pipe 111 and the outer coolant inlet pipe 115. It is preferable to cool the warm fluid discharged from the outlet pipes 112, 116 by way of a heat exchange with a chiller or the like, and circulate the cooled fluid back to the trap unit.

According to the present invention, as described above, the continuous processing trap apparatus is capable of maintaining a desired exhaust capability while keeping the conductance thereof, and also of increasing the trapping efficiency of reaction by-products in the exhaust gases. Since the continuous processing trap apparatus can reliably monitor the sealing capability, any unwanted trouble thereof in the evacuating line can be reduced, burden of periodical maintenance is lightened, and the overall downtime of the evacuating system can also be reduced.

As the trapping efficiency of reaction by-products in the exhaust gases is progressively higher toward the center of the trap unit, the reaction by-products are prevented from contacting the casing or dropping off or damaging the interior of the casing or entering (or engaging) the seals while the trap units are being moved into the trapping and regenerating positions. Therefore, the continuous processing trap apparatus is capable of performing stable trapping and regenerating operations.

Although certain preferred embodiments of the present invention has been shown and described in detail, it should be understood that various changes and modifications may be made therein without departing from the scope of the appended claims.

What is claimed is:

1. A trap apparatus comprising:

an exhaust passage for evacuating a sealed chamber by a vacuum pump;

a regenerating passage disposed adjacent to said exhaust passage;

a sealed trapping and regenerating casing extending across said exhaust passage and said regenerating passage;

a trap unit movably housed in said trapping and regenerating casing for selective movement between a trapping position connected to said exhaust passage and a regenerating position connected to said regenerating passage;

a first valve body disposed on one side of said trap unit;

a second valve body disposed on a second side of said trap unit;

a first seal disposed on an outer circumferential surface of said first valve body; and a second seal disposed on an outer circumferential surface of said second valve body, wherein said first and second seals can be projected so as to be in close contact with the inner circumferential surface of said trapping and regenerating casing, and each of said first and second seals can be retracted so as not to be in contact with the inner circumferential surface of said trapping and regenerating casing.

2. A trap apparatus according to claim 1, wherein each of said first and second valve bodies comprises movable plates for projecting said corresponding seal into contact with the inner circumferential surface of said trapping and regenerating casing and for retracting said seal to a position that is not in contact with the inner circumferential surface of said trapping and regenerating casing.

3. A trap apparatus according to claim 1, wherein said seal comprises a double seal.

4. A trap apparatus according to claim 3, wherein a seal monitoring mechanism is provided for monitoring sealing variations in sealed spaces between each of said double seals.

5. A trap apparatus according to claim 4, wherein said seal monitoring mechanism comprises a pressure sensor for detecting pressure variations in said sealed spaces.

6. A trap apparatus according to claim 4, wherein said seal monitoring mechanism comprising a mass flow meter for detecting flow rate variations from said sealed spaces.

7. A trap apparatus according to claim 4, wherein said seal monitoring mechanism comprises a device for creating a vacuum in said sealed spaces and monitoring a sealing capability of the seals based on a variation of said vacuum.

8. A trap apparatus according to claim 4, wherein said seal monitoring mechanism comprises a device for creating a pressurized state in said sealed spaces and monitoring a sealing capability of the seals based on a variation in the pressurized state.

9. A trap apparatus according to claim 1, wherein said trap unit has a trapping efficiency that is greater toward the center of the trap unit.

10. A trap apparatus according to claim 1, wherein each of said first and second valve bodies comprises a pair of discs that are movable toward and away from each other.

11. A trap apparatus according to claim 10, wherein each disc of said pair of discs has a tapered surface on its outer circumferential edge.

12. A trap apparatus according to claim 11, wherein the tapered surfaces of said pair of discs of said first valve body oppose each other so as to form a recess in which the first seal is disposed.

* * * * *